US007998651B2

(12) United States Patent
Wuister et al.

(10) Patent No.: US 7,998,651 B2
(45) Date of Patent: Aug. 16, 2011

(54) IMPRINT LITHOGRAPHY

(75) Inventors: Sander Frederik Wuister, Eindhoven (NL); Johan Frederik Dijksman, Weert (NL); Yvonne Wendela Kruijt-Stegeman, Eindhoven (NL); Ivar Schram, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 1492 days.

(21) Appl. No.: 11/433,765

(22) Filed: May 15, 2006

(65) Prior Publication Data
US 2007/0264591 A1    Nov. 15, 2007

(51) Int. Cl.
C03C 15/00    (2006.01)
G03C 5/00    (2006.01)

(52) U.S. Cl. .............................. 430/269; 216/27; 216/57
(58) Field of Classification Search .......................... None
See application file for complete search history.

(56) References Cited

U.S. PATENT DOCUMENTS

| 4,512,848 | A * | 4/1985 | Deckman et al. ................ 216/43 |
| 6,482,742 | B1 | 11/2002 | Chou |
| 6,517,977 | B2 * | 2/2003 | Resnick et al. ..................... 430/5 |
| 7,037,639 | B2 * | 5/2006 | Voisin ........................... 430/316 |
| 7,046,476 | B1 * | 5/2006 | Albrecht et al. ........... 360/77.02 |
| 7,727,453 | B2 * | 6/2010 | Sreenivasan et al. ......... 264/494 |
| 2003/0071016 | A1 * | 4/2003 | Shih et al. ........................ 216/54 |
| 2003/0205657 | A1 * | 11/2003 | Voisin ........................ 249/187.1 |
| 2003/0205658 | A1 * | 11/2003 | Voisin ........................ 249/187.1 |
| 2003/0235787 | A1 * | 12/2003 | Watts et al. ................. 430/280.1 |
| 2004/0007799 | A1 * | 1/2004 | Choi et al. ...................... 264/494 |
| 2004/0008334 | A1 * | 1/2004 | Sreenivasan et al. ........... 355/72 |
| 2004/0021254 | A1 * | 2/2004 | Sreenivasan et al. ......... 264/406 |
| 2004/0021866 | A1 * | 2/2004 | Watts et al. .................... 356/401 |
| 2004/0046271 | A1 * | 3/2004 | Watts ............................ 264/1.25 |
| 2004/0223883 | A1 * | 11/2004 | Choi et al. ................. 422/82.05 |
| 2004/0250945 | A1 * | 12/2004 | Zheng et al. ................... 156/230 |
| 2005/0028618 | A1 * | 2/2005 | Chol et al. ..................... 73/865.9 |
| 2005/0100830 | A1 * | 5/2005 | Xu et al. ........................ 430/322 |
| 2005/0202350 | A1 * | 9/2005 | Colburn et al. ............... 430/320 |
| 2005/0230882 | A1 * | 10/2005 | Watts et al. ................... 264/496 |
| 2006/0006057 | A1 * | 1/2006 | Laermer ....................... 204/164 |
| 2006/0035164 | A1 | 2/2006 | Schaper |
| 2006/0279025 | A1 * | 12/2006 | Heidari et al. ................ 264/496 |
| 2006/0286490 | A1 * | 12/2006 | Sandhu et al. ................ 430/394 |

(Continued)

FOREIGN PATENT DOCUMENTS

WO    2004/027460 A2    4/2004

OTHER PUBLICATIONS

Notice of Reasons for Rejection for Japanese Patent Application No. 2007-123276 dated May 6, 2010.

*Primary Examiner* — Allan Olsen
(74) *Attorney, Agent, or Firm* — Pillsbury Winthrop Shaw Pittman LLP

(57)    ABSTRACT

A method of making an imprint template includes providing a transfer layer on a substrate and providing a layer of imprintable medium on the transfer layer, using a master imprint template to imprint a pattern into the imprintable medium, polymerizing the imprintable medium by exposing it to actinic radiation, then etching the resulting polymer layer, the transfer layer and the substrate such that the imprinted pattern is transferred to the substrate, the substrate thereby becoming an imprint template bearing a pattern which is the inverse of a pattern provided on the master imprint template.

20 Claims, 6 Drawing Sheets

U.S. PATENT DOCUMENTS

2007/0104813 A1* 5/2007 Wuister et al. ............. 425/174.4
2007/0134362 A1* 6/2007 Heidari ......................... 425/385
2007/0145643 A1* 6/2007 Dijksman et al. ............. 264/319
2007/0212522 A1* 9/2007 Heidari et al. ................ 428/141
2007/0238037 A1* 10/2007 Wuister et al. .................. 430/22
2007/0261016 A1* 11/2007 Sandhu et al. ................... 716/19
2008/0011934 A1* 1/2008 Verschuuren et al. ........ 249/134
2010/0258966 A1* 10/2010 Sandhu ......................... 264/104

* cited by examiner

IMPRINT LITHOGRAPHY

BACKGROUND OF THE INVENTION

1. Field of the Invention

The present invention relates to imprint lithography.

2. Description of the Related Art

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, includes transferring a pattern to a substrate by imprinting a pattern into an imprintable medium using a physical mold or imprint template. The imprintable medium may be the substrate or a material coated on to a surface of the substrate. The imprintable medium may be functional or may be used as a "mask" to transfer a pattern to an underlying surface. The imprintable medium may for example be provided as a resist deposited on a substrate such as a semiconductor material to which the pattern defined by the imprint template is to be transferred. Imprint lithography is thus essentially a molding process on a micrometer or nanometer scale in which the topography of a imprint template defines the patterns created on a substrate. Patterns may be layered as with optical lithography processes so that in principle imprint lithography could be used for such applications as IC manufacture.

The resolution of imprint lithography is limited only by the resolution of the imprint template fabrication process. For example, imprint lithography has been used to produce features in the sub-50 nm range with significantly improved resolution and line edge roughness compared to that achievable with conventional optical lithography processes. In addition, imprint processes do not require expensive optics, advanced illumination sources or specialised resist materials typically required by optical lithography processes.

Fabrication of imprint templates is typically performed using electron beam lithography, which is generally time consuming and expensive (electron beam lithography machines are expensive to buy and to run).

SUMMARY OF THE INVENTION

According to a first embodiment of the present invention there is provided a method of making an imprint template, the method including providing a planarization layer on a substrate and providing a layer of imprintable medium on the planarization layer, using a master imprint template to imprint a pattern into the imprintable medium, polymerizing the imprintable medium by exposing it to actinic radiation, then etching the resulting polymer layer, the planarization layer and the substrate such that the imprinted pattern is transferred to the substrate, the substrate thereby becoming an imprint template bearing a pattern which is the inverse of a pattern provided on the master imprint template.

According to a second embodiment of the invention there is provided a method of making an imprint template, the method including providing a planarization layer on a substrate and providing a layer of imprintable medium on the planarization layer, using a master imprint template to imprint a pattern into the imprintable medium, polymerizing the imprintable medium by exposing it to actinic radiation, providing a silicon rich layer on the resulting patterned polymer layer, polymerizing the silicon rich layer by exposing it to actinic radiation, then etching the resulting polymerised silicon rich layer, the polymer layer, the planarization layer and the substrate such that the imprinted pattern is transferred to the substrate, the substrate thereby becoming an imprint template bearing a pattern which corresponds to a pattern on the master imprint template.

Further features of one or more embodiments of the present invention will be apparent from the following description.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
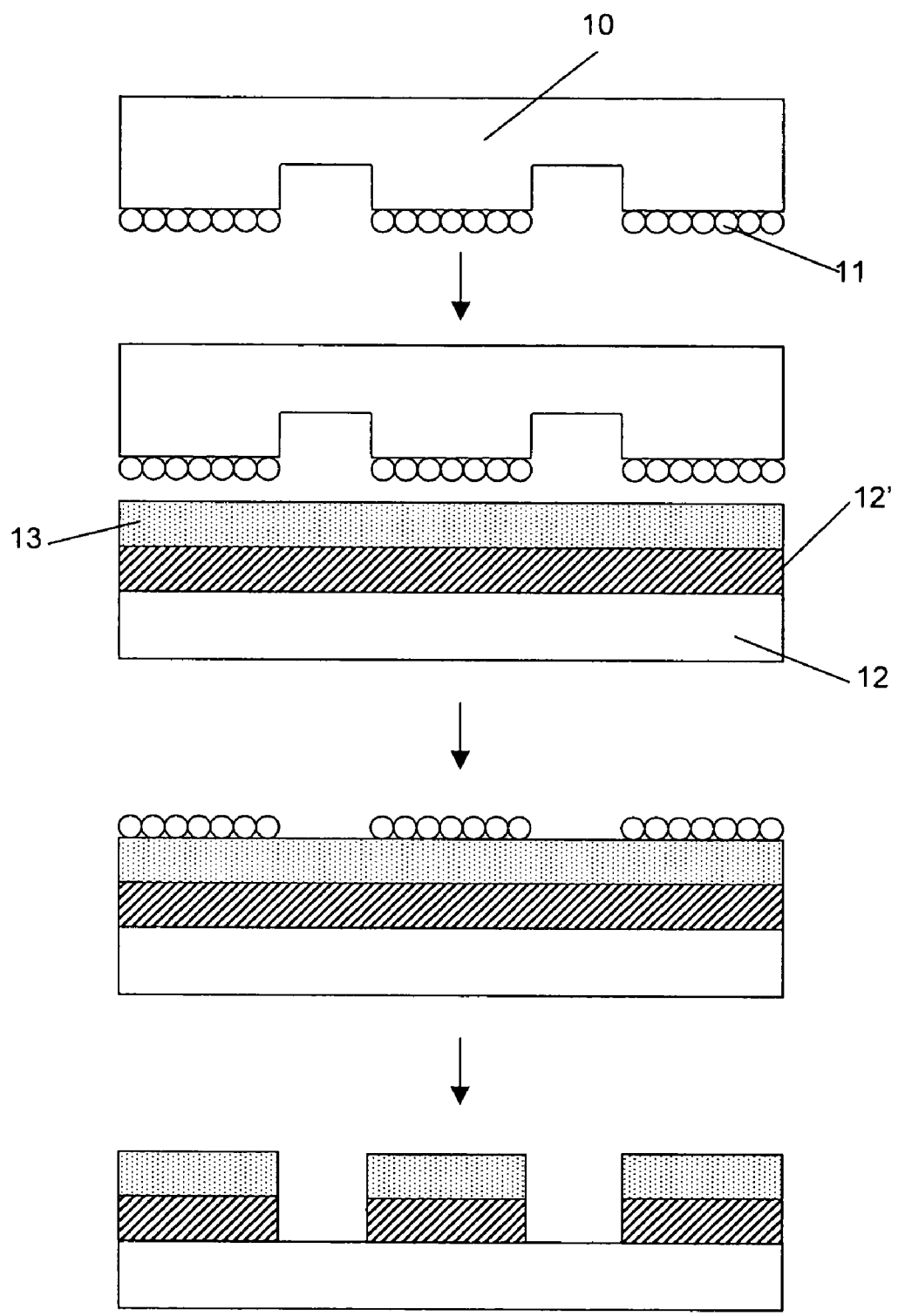
FIG. 1a-1c illustrate examples of conventional soft, hot and UV lithography processes respectively.
Figure 1B:
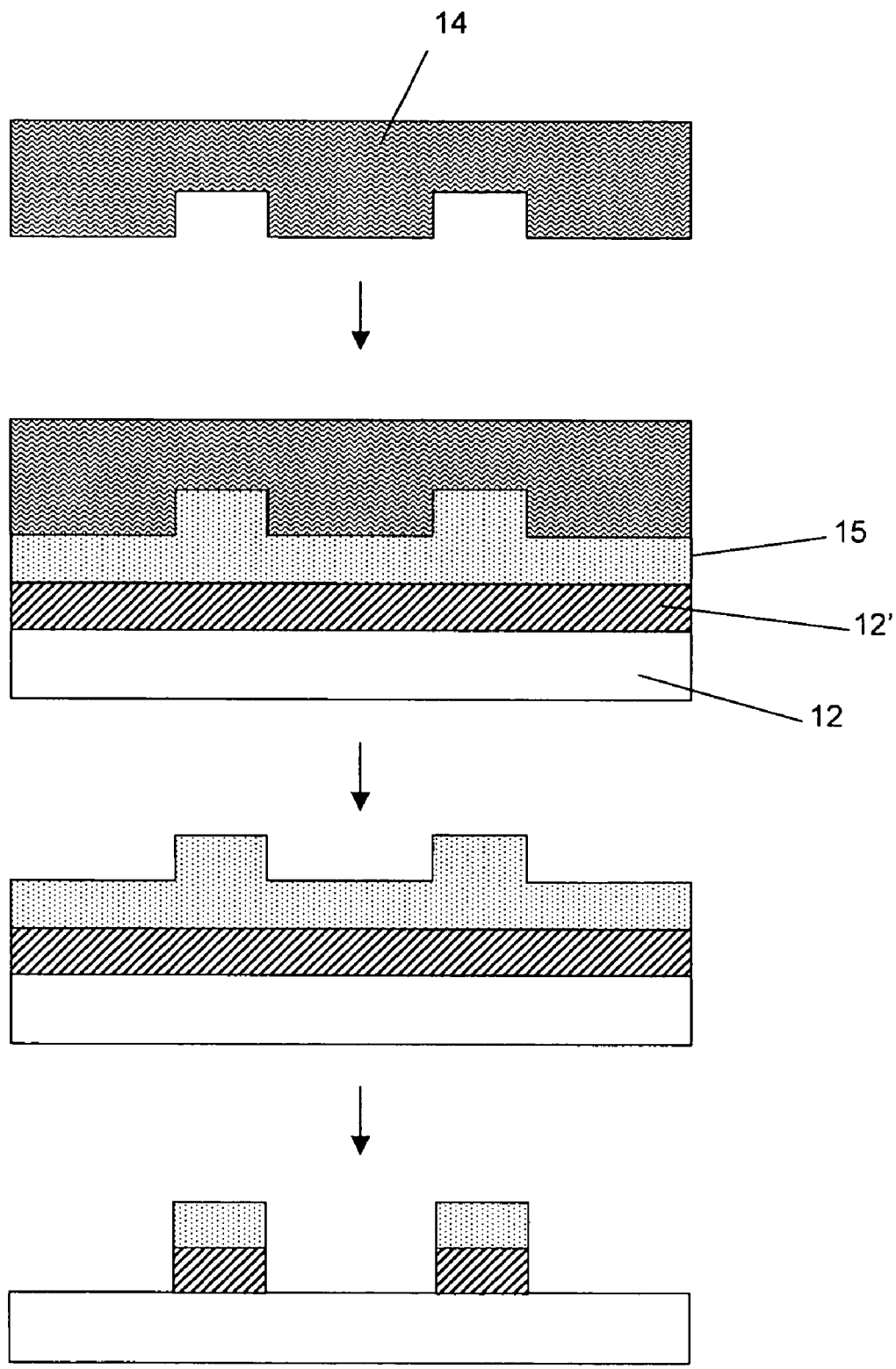
Figure 1C:
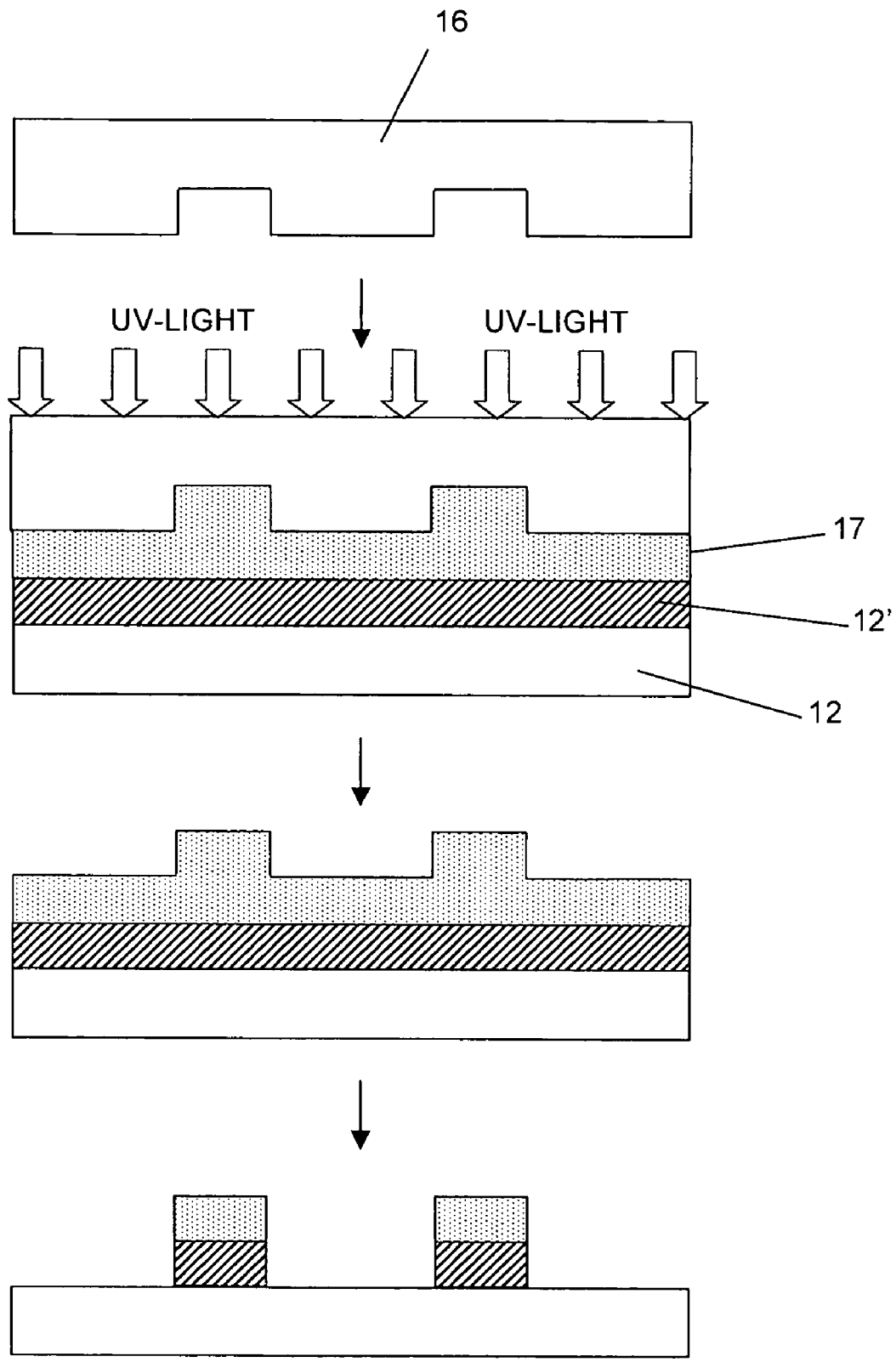

FIG. 1a shows the soft lithography process which involves transferring a layer of molecules 11 (typically an ink such as a thiol) from a flexible imprint template 10 (typically fabricated from polydimethylsiloxane (PDMS) onto a resist layer 13 which is supported upon a substrate 12 and planarization and transfer layer 12'. The imprint template 10 has a pattern of features on its surface, the molecular layer being disposed upon the features. When the imprint template is pressed against the resist layer the layer of molecules 11 stick to the resist. Upon removal of the imprint template 10 from the resist 13 the layer of molecules 11 stick to the resist 13, the residual layer of resist is etched such that the areas of the resist not covered by the transferred molecular layer are etched down to the substrate.

The imprint template used in soft lithography may be easily deformed and may therefore not be suited to high resolution applications, e.g. on a nanometer scale, since the deformation of the imprint template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses harder imprint templates made from, for example, silicon or nickel, which are more resistant to wear and deformation. This is described for example in U.S. Pat. No. 6,482,742 and illustrated in FIG. 1b. In a typical hot imprint process a solid imprint template 14 is imprinted into a thermosetting or a thermoplastic polymer resin 15, which has been cast on the surface of a substrate 12. The resin may for example be spin coated and baked onto the substrate surface or more typically (as in the example illustrated) onto a planarization and transfer layer 12'. It shall be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used the resin is heated to a temperature such that, upon contact with the imprint template, the resin is sufficiently flowable to flow into the pattern features defined on the imprint template. The temperature of the resin is then increased to thermally cure (e.g. crosslink) the resin so that it solidifies and irreversibly adopts the desired pattern. The imprint template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the imprint template. It is typically necessary to heat thermoplastic resins to temperatures considerably above the glass transition temperature of the resin. The imprint template is pressed into the flowable resin and sufficient pressure is applied to ensure the resin flows into all the pattern features defined on the imprint template. The resin is then cooled to below its glass transition temperature with the imprint template in place whereupon the resin irreversibly adopts the desired pattern. The pattern will consist of the features in relief from a residual layer of the resin which may then be removed by an appropriate etch process to leave only the pattern features.

Figure 2:
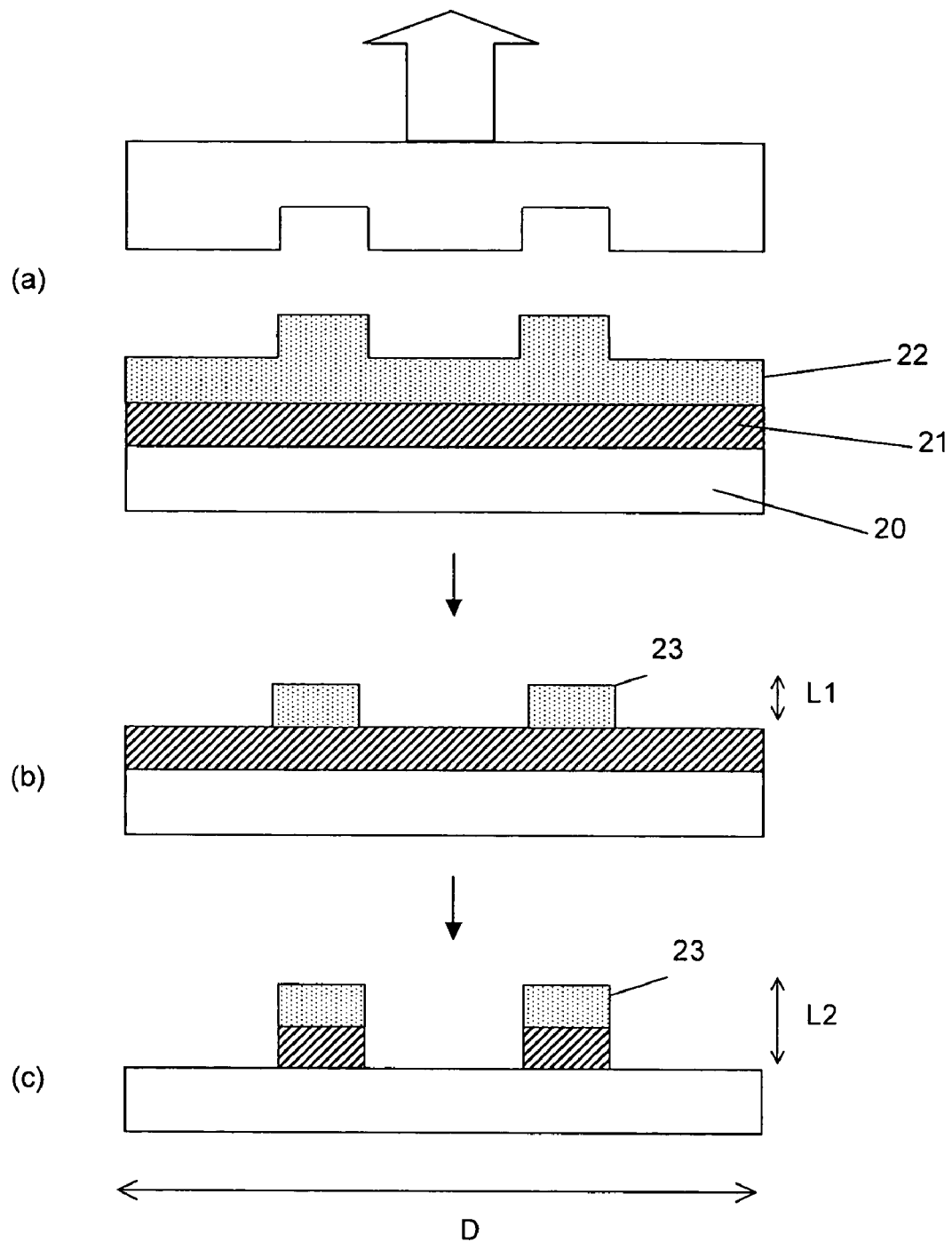
FIG. 2 illustrates a two step etching process employed when hot and UV imprint lithography is used to pattern a resist layer.

Upon removal of the imprint template from the solidified resin, a two-step etching process is performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface parallel to that of the imprint template, which tends to ensure that the contact between the imprint template and the resin is parallel, and also to improve the aspect ratio of the printed features, as will be described below.

After the imprint template has been removed, a residual layer 22 of the solidified resin is left on the planarization and transfer layer, shaped in the desired pattern. The first etch is isotropic and removes parts of the residual layer, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer which are not covered by the solidified resin, increasing the aspect ratio of the features 23 to (L2/D), as shown in FIG. 2c. The resulting polymer thickness contrast left on the substrate after etching can be used as for example a mask for dry etching if the imprinted polymer is sufficiently resistant, for example as a step in a lift-off process.

In hot imprint lithography, not only is the pattern transfer performed at a higher temperature, which is undesirable, but also relatively large temperature differentials might be required in order to ensure the resin is adequately solidified before the imprint template is removed. Temperature differentials between 35 and 100° C. are known from literature. Differential thermal expansion between for example the substrate and imprint template can then lead to distortion in the transferred pattern. The problem is exacerbated by the relatively high pressures used for the imprinting, due the viscous nature of the imprintable materials, which can induce mechanical deformation in the substrate, again distorting the pattern.

UV imprint lithography on the other hand does not involve such high temperatures and temperature changes. Nor does it require such viscous imprintable materials. Rather UV imprint lithography involves the use of a transparent imprint template and a UV-curable medium, typically a monomer such as an acrylate or methacrylate for example. In general any photopolymerizable material could be used, such as a mixture of monomers and an initiator. The curable medium may also for example include a dimethyl siloxane derivative. Such materials are much less viscous than the thermosetting and thermoplastic resins used in hot imprint lithography and consequently move much faster to fill imprint template pattern features. Low temperature and low pressure operation also favours higher throughput capabilities. Although the name 'UV imprint lithography' implies that UV light is always used, it should be appreciated that any suitable actinic radiation may be used (for example visible light may be used). Hence, any reference in this document to UV imprint lithography, UV light, or UV curable materials, etc should be interpreted as including any suitable actinic radiation, and should not be interpreted as being limited to UV light only.

An example of a UV imprint process is illustrated in FIG. 1c. A quartz imprint template 16 is applied to a UV-curable resin 17 in a similar manner to the process of FIG. 1b. Instead of raising the temperature as in hot embossing employing thermosetting resins, or temperature cycling when using thermoplastic resins, UV light is applied to the resin through the quartz imprint template in order to polymerize and thus cure it. Upon removal of the imprint template, the remaining etching of the residual layer of resist are the same as for the hot embossing process described above. The UV curable resins typically used have a much lower viscosity than typical thermoplastic resins so that lower imprint pressures are used. Reduced physical deformation due to the lower pressures, together with reduced deformation due to high temperatures and temperature changes, makes UV imprint lithography better suited to application requiring high overlay accuracy. In addition the transparent nature of UV imprint templates can accommodate optical alignment techniques simultaneously to the imprint.

Although this type of imprint lithography mainly uses UV curable materials, and is thus generically referred to as UV imprint lithography, other wavelengths of light may be used to cure appropriately selected materials (e.g. activate a polymerization or cross linking reaction). In general any radiation capable of initiating such a chemical reaction may be used if an appropriate imprintable material is available. Such radiation, which is commonly referred to as actinic radiation, may for example include visible light, infrared light, x-ray radiation and electron beam radiation. In the general description above, and below, references to UV imprint lithography and use of UV light are not intended to exclude these and other actinic radiation.

As an alternative to imprint systems using a planar imprint template which is maintained substantially parallel to the substrate surface, roller imprint systems have been developed. Both hot and UV roller imprint systems have been proposed in which the imprint template is formed on a roller but otherwise the imprint process is very similar to imprinting using a planar imprint template. Unless the context requires otherwise, references to an imprint template include references to roller imprint templates.

There is a particular development of UV imprint technology known as step and flash imprint lithography (SFIL) which may be used to pattern a substrate in small steps in a similar manner to optical steppers conventionally used in IC manufacture. This involves printing small areas of the substrate one at a time by imprinting a imprint template into a UV curable resin, 'flashing' UV light through the imprint template to cure the resin beneath the imprint template, removing the imprint template, stepping to an adjacent region of the substrate and repeating the operation. The small field size of such step and repeat processes minimises pattern distortions and CD variations so that SFIL is particularly suited to manufacture of IC and other devices requiring high overlay accuracy.

Although in principle the UV curable resin can be applied to the entire substrate surface, for example by spin coating, this is problematic due to the volatile nature of UV curable resins.

One approach to addressing this problem is the so-called 'drop on demand' process in which the resin is dispensed onto a target portion of the substrate in droplets immediately prior to imprinting with the imprint template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned presents various considerations. The size and spacing of the droplets are carefully controlled to ensure there is sufficient resin to fill imprint template features while at the same time minimizing excess resin which can be rolled to an undesirably thick or uneven residual layer since as soon as neighbouring drops touch fluid the resin will have nowhere to flow. The problems associated with overly thick or uneven residual layer are discussed below.

Figure 3:
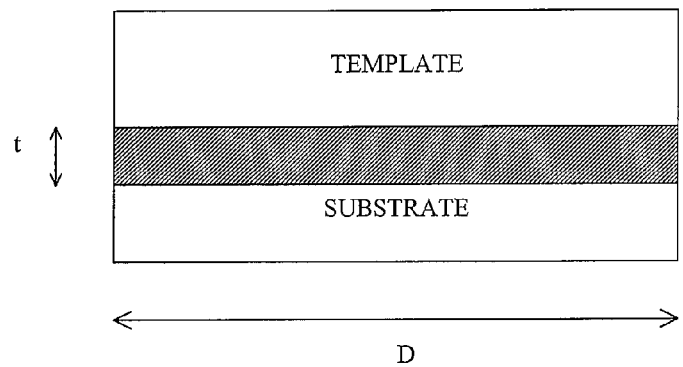
FIG. 3 schematically illustrates an imprint template and a typical imprintable resist layer deposited on a substrate.

FIG. 3 illustrates the relative dimensions of the imprint template, imprintable material (curable monomer, thermosetting resin, thermoplastic, etc.) and substrate. The ratio of the width D of the substrate to the thickness t of the curable resin layer is of the order of $10^6$. It will be appreciated that, in order to avoid features projecting from the imprint template damaging the substrate, the thickness t should be greater than the depth of the projecting features on the imprint template.

The residual layer left after stamping is useful in protecting the underlying substrate, but as mentioned above it is also the source of a number of problems particularly when high resolution and/or overlay accuracy is desired. The first 'breakthrough' etch is isotropic (non-selective) and will thus to some extent erode the features imprinted as well as the residual layer. This is exacerbated if the residual layer is overly thick and/or uneven.

This problem can for example lead to variation in the thickness of lines ultimately formed in the underlying substrate (i.e. variation in the critical dimension). The uniformity of the thickness of a line that is etched in the transfer layer in the second anisotropic etch is dependent upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process.

In principle the above problem can be reduced by ensuring the residual layer is as thin as possible but this can require application of undesirably large pressures (increasing substrate deformation) and relatively long imprinting times (reducing throughput).

The imprint template is a component of the imprint lithography system that requires consideration. As noted above, the resolution of the features on the imprint template surface is a limiting factor on the attainable resolution of features printed on the substrate. The imprint templates used for hot and UV lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the imprint template. Other techniques such as for example ion-beam lithography, X-ray lithography, extreme UV lithography, epitaxial growth, thin film deposition, chemical etching, plasma etching, ion etching or ion milling could be used. Generally a technique capable of very high resolution will be preferred as the imprint template is effectively a 1× mask with the resolution of the transferred pattern being limited by the resolution of the pattern on the imprint template.

The release characteristics of the imprint template may also be an important consideration. The imprint template may for example be treated with a surface treatment material to form a thin release layer on the imprint template having a low surface energy (a thin release layer may also be deposited on the substrate).

Although reference is made above to depositing UV curable mediums onto a substrate, the liquids could also be deposited on the imprint template and in general the same techniques and considerations will apply.

Another important consideration in the development of imprint lithography is the mechanical durability of the imprint template. The imprint template is subjected to large forces during stamping of the resist, and in the case of hot lithography, it is also subjected to extremes of pressure and temperature. This will cause wearing of the imprint template, and may adversely affect the shape of the pattern imprinted upon the substrate.

In hot imprint lithography there are potential benefits in using a imprint template of the same or similar material to the substrate to be patterned in order to minimize differential thermal expansion between the two. In UV imprint lithography the imprint template is at least partially transparent to the activation light and accordingly quartz imprint templates are used. Although specific reference may be made in this text to the use of imprint lithography in the manufacture of ICs, it should be appreciated that imprint apparatus and methods described may have other applications, such as the manufacture of integrated optical systems, guidance and detection patterns for magnetic domain memories, hard disc magnetic media, flat panel displays, thin-film magnetic heads, etc.

While in the description above particular reference has been made to the use of imprint lithography to transfer a imprint template pattern to a substrate via an imprintable resin effectively acting as a resist, in some circumstances the imprintable material may itself be a functional material, for example having a functionally such as conductivity, optical linear or non linear response amongst others. For example the functional material may form a conductive layer, a semiconductive layer, a dielectric layer or a layer having another desirable mechanical, electrical or optical property. Some organic substances may also be appropriate functional materials. Such applications may be within the scope of an embodiment of the present invention.

In some instances it may be desired to have more than one imprint template bearing the same pattern. Where this is the case it is conventional to make each of the imprint templates using electron beam lithography, as described above. An embodiment of the invention provides an alternative method of making an imprint template. The embodiment of the invention is particularly suited to, although not limited to, making multiple imprint templates bearing the same pattern.

Figure 4:
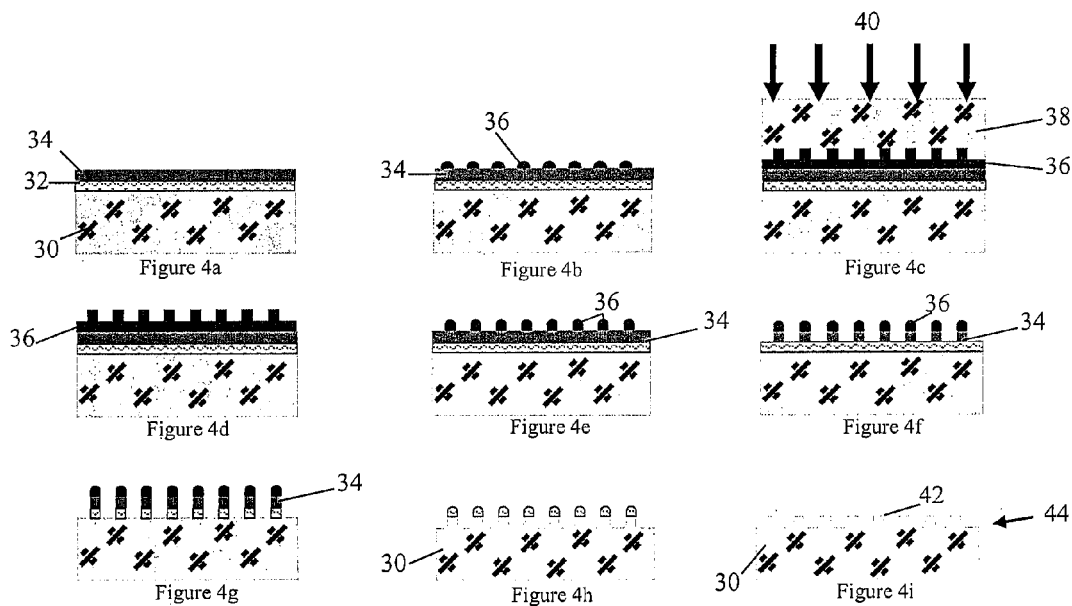
FIG. 4 schematically illustrates a method of fabricating an imprint template according to a first embodiment of the invention.

A method according to an embodiment of the invention is shown schematically in FIG. 4. A quartz substrate 30 is provided with a layer of chromium 32, for example using chemical vapor deposition or sputtering. The chromium layer may for example be 15 nm thick. A layer of organic resist 34 is provided on top of the chromium layer 32. The organic resist is selected to have good adhesion to the chromium layer (for example an organic resist suitable for use in e-beam patterning). The organic resist may be PMMA. A monolayer of primer molecules can be-used instead of the organic resist (e.g. (3-Acryloyloxypropyl)trimethoxysilane or [3-(Methacryloyloxy)propyl]trimethoxysilane)).

Referring to FIG. 4b, an array of droplets of imprintable medium 36 is deposited onto the organic resist layer 34. This may for example be done using ink-jet printing techniques. The imprintable medium 36 includes silicon containing monomers, silicon containing cross-linkers and a photo initiator. Examples of the monomer and cross-linker are 3-(acryloxypropyl)tris(trimethylsiloxy)-silane and 1,3-bis 3-methacryloxypropyl tetra-methyldisiloxane. Non-silicon containing monomers and/or cross-linkers may be used in combination with the silicon containing reactive monomers and cross-linkers. For example, the imprintable medium 36 may include 12% silicon, such that there is room for some silicon free acrylates that may improve the mechanical and curing properties of the organic resist. Chlorinated monomers (acrylates, epoxies, methacrylates, vinyl) may be used as the imprintable medium 36, chlorine reduces the etch rate of the polymer when etching chromium (this etching step is described further below). Chlorinated monomers may be mixed with non-chlorinated monomers or cross-linkers. Examples are: Methyl alpha-chloroacrylate, 2-chloroacrylic acid, 3-Chloropropene, 2-Chloroethyl Methacrylate, 2-Hydroxy-3-Chloropropyl Acrylate, 2,3-dichloro-1-propyl acrylate, 1,3-dichloro-2-propyl acrylate, 2-chloroethyl acrylate and 2,2,2-trichloroethyl acrylate. The chlorinated monomers may be useful if a monolayer of primer molecules has been used in place of the organic resist 34, or if there is no organic resist (this possibility is explained further below).

The imprintable medium 36 should wet the organic resist layer 34; i.e. the contact angle of the imprintable medium on the organic resist layer should be greater than 90° This will allow the imprintable medium to spread more easily across the surface.

Referring to FIG. 4c, a master imprint template 38 bearing a pattern which is the inverse of a desired pattern is brought into contact with the imprintable medium 36. The master imprint template 38 may be provided with a release layer (not shown). The release layer may include for example trichloro (1H,1H,2H,2H-Perfluorodecane)silane. A suitable time is allowed to elapse such that the imprintable medium 36 may flow into recesses of the pattern on the master imprint template 38. Ultraviolet radiation 40 (or other actinic radiation) is directed through the master imprint template 38 onto the imprintable medium 36. This causes the imprintable medium 36 to polymerize, to form a silicon rich polymer 36. The silicon rich polymer 36 is a solid, with the effect that when the master imprint template 38 is retracted, a pattern remains in the silicon rich polymer as shown in FIG. 4d. The pattern is the inverse of the pattern on the master imprint template 38 (i.e. the pattern corresponds to the desired pattern).

A directional breakthrough etch is then used to homogonously decrease the silicon rich polymer 36. In other words, silicon rich polymer 36 is etched away by substantially the same amount right across the surface area of the pattern. The result of this is that, as can be seen in FIG. 4e, a residual layer of silicon rich polymer 36 which was present right across the substrate is etched away. The imprinted pattern remain in the silicon rich polymer 36, but now extend to a lesser height above the organic resist layer 34. The etch removes sufficient silicon rich polymer 36 that organic resist 34 is exposed at recess of the pattern. Suitable etches that may be used for the directional breakthrough etch include a reactive ion etch using a fluorine or fluorine/oxygen plasma.

Referring to FIG. 4f, a directional transfer etch is used to pattern the organic resist layer 34 (i.e. to etch the pattern of the silicon rich polymer 36 into the organic resist layer). A suitable etch which may be used for the directional transfer etch is a reactive ion etch using an oxygen plasma. The creation of high aspect ratio features arises from selectivity between the silicon rich polymer layer 36 and the organic resist layer 34.

Referring to FIG. 4g, the chromium layer 32 is patterned using a directional chromium etch, for example a reactive ion etch using a chlorine/oxygen plasma. The silicon rich polymer 36 has a high organic resistance against the chromium etch, and thereby ensures that the pattern in the silicon rich polymer is transferred into the chromium layer 32. The organic resist 34 may also have a high organic resistance against the chromium etch for the same reason. In some instances, the silicon rich polymer may 36 have lower organic resistance against the directional chromium etch, but this will not cause a significant problem provided that the organic resist 34 has a sufficiently high organic resistance. In general, either or both of the silicon rich polymer 36 and the organic resist 34 must have sufficient organic resistance against the chromium etch that they remain (and the pattern that they form remains) during etching of the chromium layer 32.

Referring to FIG. 4h, the organic resist 34 is stripped away, for example by dissolving it in a suitable organic solvent. This leaves behind the quartz substrate 30 and the patterned chromium layer 32. The quartz is directionally etched, for example using a reactive ion etch with a fluorine plasma (the chromium acting as a hard mask). The pattern is thereby etched into the quartz substrate 30. The etched substrate 30 is shown in FIG. 4h.

Referring to FIG. 4i, the chromium 32 is stripped away from the substrate 30 using a wet etch, leaving behind the quartz substrate 30 with the desired imprint pattern 42. The wet etch may for example use a mixture of acetic acid and ceric ammonium nitrate, for example Cyantek CR-14 (available from Cyantek Corporation of Fremont, Calif., USA).

Referring to FIG. 4i, an imprint template 44 has been formed, bearing a pattern which is an inverse of the pattern 42 on the master imprint template 38. Provided that the pattern provided on the master imprint template 38 is the inverse of a desired pattern, the imprint template 44 will have the desired pattern, and may be used to imprint organic resist provided on substrates. Since the imprint template 44 is formed from quartz, it is transparent to UV radiation (or other suitable actinic radiation). The imprint template 44 may thus be used for UV lithography.

A separate process may be needed to form the master imprint template 38 with the inverse pattern. This may be done for example by forming the desired pattern on an initial imprint template using e-beam lithography in a conventional manner, then using the method described above to form the master imprint template 38 using the initial imprint template.

Figure 5:
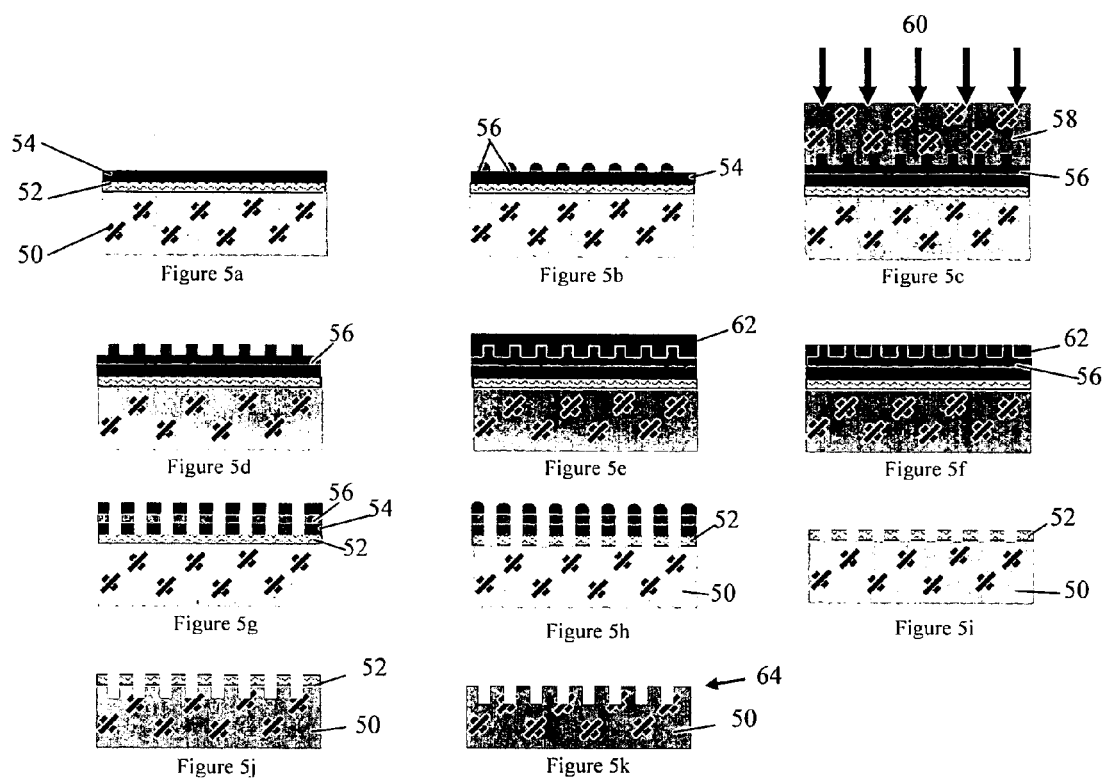
FIG. 5 schematically illustrates a method of fabricating an imprint template according to a second embodiment of the invention.

FIG. 5 schematically illustrates a method according to an embodiment of the invention, in which an imprint template may be formed with a pattern which corresponds to (rather than being an inverse of) a pattern provided on a master imprint template. Referring to FIG. 5a, a quartz substrate 50 is provided with a layer of chromium 52, for example using chemical vapor deposition or sputtering. The chromium layer 52 may for example be 15 nm thick. A layer of resist 54 is provided on top of the chromium layer 52. The resist is selected to adhere well to the chromium layer 52, and may for example be a resist which is used during e-beam patterning. ZEP e-beam resists from Nippon Zeon, Tokyo, Japan may for example be used. A monolayer of primer molecules can be used instead of the resist (e.g. (3-Acryloyloxypropyl)trimethoxysilane or [3-(Methacryloyloxy)propyl]trimethoxysilane)).

Referring to FIG. 5b, droplets of an imprintable medium 56 are deposited on top of the resist layer 54. The imprintable medium 56 includes a non-silicon containing blend of monomer, cross-linker and photo-initiator. The droplets may be deposited onto the resist layer 54 using ink-jet printing techniques. A master imprint template 58 bearing a desired pattern is pressed onto the imprintable medium 56, as shown in FIG. 5c. The master imprint template 58 may include a suitable release layer (not shown). The release layer may include for example trichloro(1H,1H,2H,2H-Perfluorodecane)silane. A suitable time is allowed to elapse such that the imprintable medium 56 may flow into recesses of the pattern provided on the master imprint template 58. Actinic radiation 60, which may for example be ultraviolet radiation, is then directed through the master imprint template 58 to polymerise the imprintable medium, thereby forming an imprinted polymer layer 56. Referring to FIG. 5d, the master imprint template 58 is then retracted, leaving behind the polymer layer 56 bearing a pattern which is the inverse of the pattern on the master imprint template 58.

Referring to FIG. 5e, a silicon rich layer 62 is provided on top of the imprinted polymer layer 56. The silicon rich layer 62 may for example be applied by spin coating silicon rich monomer onto the imprinted polymer layer 56 and then curing it using actinic radiation to form a silicon rich polymer layer. If desired, a flat template may be pressed against the silicon rich monomer prior to illuminating it with the actinic radiation in order to ensure that the resulting silicon rich polymer layer 62 has a flat uppermost surface. Conventional spin coating of the silicon rich layer 62 from solution is also possible.

Referring to FIG. 5f, a directional breakthrough etch is used to etch away the silicon rich polymer layer 62 until the imprinted polymer layer 56 is exposed. A suitable etch which may be used to do this is a reactive ion etch using a fluorine or fluorine/oxygen plasma.

Referring to FIG. 5g, a directional etch is used to etch through the exposed imprinted polymer layer 56, and in addition through the resist 54 which is located beneath the exposed imprinted polymer. This etch reaches down to the chromium layer 52. A suitable etch which may be used to do this is a reactive ion etch using an oxygen plasma. The silicon rich polymer 62 acts as an etch barrier. This ensures that a pattern, which is an inverse of the pattern imprinted into the polymer layer 56, is retained.

Referring to FIG. 5h, a further directional etch is used to etch through the chromium layer 52 to the substrate 50. A suitable etch which may be used to do this is a reactive ion etch using a chlorine/oxygen plasma. At least one of the three already etched layers (the silicon rich polymer 62, imprinted polymer 56 or the resist 54) are resistant against this etch.

Referring to FIG. 5i, the silicon rich polymer 62, imprinted polymer 56 and resist 54 are stripped away by dissolving the resist. This may be done using a suitable organic solvent. This leaves behind a layer of patterned chromium 52 on the quartz substrate 50.

Referring to FIG. 5j, a directional etch is used to etch into the quartz substrate 50, thereby transferring the pattern in the chromium layer 52 into the quartz substrate. A suitable directional etch which may be used to do this is a reactive ion etch using a fluorine plasma.

Referring to FIG. 5k, the chromium layer 52 is then stripped away using a wet etch, leaving behind the quartz substrate 50 bearing a pattern which corresponds to the pattern on the original master imprint template 58. The wet etch may for example use a mixture of acetic acid and ceric ammonium nitrate, for example Cyantek CR-14 (available from Cyantek Corporation of Fremont, Calif., USA).

The method described in relation to FIG. 5 provides an imprint template 64 bearing a pattern which corresponds to the pattern on the master imprint template 58. The term 'master' is intended to mean that the master imprint template 58 may be used to generate many imprint templates (if desired). Since the imprint template 64 is formed from quartz, it is transparent to UV radiation (or other suitable actinic radiation). The imprint template 64 may thus be used for UV lithography.

The chromium layer has been described in the above examples as being 15 nanometers in thickness. It should be appreciated that other thicknesses of chromium layer may be used. In general, it is not necessary to provide a much thicker chromium layer, since the chromium provides high etch selectivity (in the order of 20) for the substrate etch.

Although the methods described in the above examples refer to the use of a Chromium layer 32, 52, which acts as a transfer layer, the transfer layer may be formed using other suitable metals (for example Aluminium or Nickel). Indeed, a material other than metal may be used for form the transfer layer, provided that it gives sufficient etch selectivity to allow the provided pattern to be etched into the quartz substrate 30, 50 (or other material if the substrate is made from that material).

Although the methods described in the above examples refer to the use of a layer of resist 34, 54, the layer of resist is not essential. However, providing the layer of resist (or monolayer of primer molecules) gives good adhesion to the chromium layer 35, 52.

The methods described above show actinic radiation 40, 60 being directed through the master imprint template 38, 58. However, the actinic radiation may instead be directed through the quartz substrate 30, 50. Thus it is not essential that the master imprint template 38, 58 is transparent to actinic radiation.

The methods described above refer to the use of a quartz substrate 30, 50. However, the substrate may be formed from other suitable substances. If the resulting imprint template 44, 64 is intended to be used for UV imprint lithography, then it may be necessary for the substrate to be formed from a material which is transparent to UV radiation (or other actinic radiation).

In the methods described above, the term 'master' is used to allow convenient differentiation between that imprint template 38, 58 and the imprint template 44, 64 which is formed using the method. The master imprint template 38, 58 may be used to generate many imprint templates 44, 64 (if desired).

The throughput of the methods described above is not expected to be as great as the throughput for conventional imprinting of for example an integrated circuit pattern onto a silicon substrate. However, this is not a significant disadvantage since the number of imprint templates desired to be made will generally be significantly less than the number of silicon substrates desired be imprinted. The cost of forming imprint templates using the methods illustrated in FIGS. 4 and 5 is likely to be significantly less than the cost of forming an imprint template using a conventional e-beam technique.

The methods described above provide accurate replication of the master imprint template 58 (or the inverse of the master imprint template 38). This is in part achieved because the quartz substrates 30, 50 used have a low sensitivity to temperature changes (the coefficient of linear expansion is around 0.59 ppm/° C. In addition, since the master imprint templates 38, 58 and the substrates 30, 50 are both formed from quartz they both have the same response to temperature fluctuations. This further reduces the effect of any temperature variations which may arise when using the method, and contributes to the accurate replication of the pattern on the master imprint template 58 (or inverse pattern of the master imprint template 38).

The quartz substrates 30, 50 and the original templates 38, 58 may be manufactured with a high degree of flatness across the surfaces (excluding the patterns provided on the original templates). This assists in allowing the methods described above to provide patterns which have consistent critical dimensions across the quartz substrates 30, 50.

The imprint template 44, 64 that results from the above methods is mechanically robust, stable in the presence of ultraviolet light or other actinic radiation, and is transparent to ultraviolet light or other actinic radiation.

While specific examples of the invention have been described above, it should be appreciated that the present invention may be practiced otherwise than as described. The description is not intended to limit the invention.

Although the above description has referred to the use of of quartz as a substrate in which an imprint template may be formed, it will be appreciated that other suitable materials may be used, for example fused silica. If the imprint template is intended to be used for UV lithography, then the material should be substantially transparent to UV radiation (or other actinic radiation to be used).

Where the above description has referred to the use of a transfer layer, it will be appreciated that this term may be replaced by the term 'planarization layer'.

What is claimed is:

1. A method of making an imprint template, comprising:
providing a metal transfer layer on a substrate;
providing a layer of imprintable medium on the metal transfer layer;
using a master imprint template to imprint a pattern into the imprintable medium;
polymerizing the imprintable medium by exposing it to actinic radiation; and
etching the resulting polymer layer, the metal transfer layer and the substrate such that the imprinted pattern is transferred to the substrate and the polymer layer and the metal transfer layer are stripped from the substrate, the substrate thereby becoming an imprint template bearing a pattern which is the inverse of a pattern provided on the master imprint template.

2. The method of claim 1, wherein the imprintable medium comprises silicon.

3. The method of claim 1, wherein the metal transfer layer is Chromium, Aluminium or Nickel.

4. The method of claim 1, wherein the substrate is quartz or fused silica.

5. The method of claim 1, wherein the imprintable medium comprises a chlorinated monomer.

6. The method of claim 1, wherein the imprintable medium includes a silicon containing monomer, a silicon containing cross-linker and a photo initiator.

7. The method of claim 6, wherein the monomer and cross-linker are 3-(acryloxypropyl)tris(trimethylsiloxy)-silane and 1,3-bis 3-methacryloxypropyl tetra-methyldisiloxane.

8. The method of claim 1, wherein the polymer layer is etched using a directional breakthrough etch.

9. The method of claim 8, wherein the metal transfer layer is etched using a directional etch.

10. The method of claim 9, wherein the directional etch is a reactive ion etch.

11. The method of claim 9, wherein the substrate is etched using a directional etch.

12. The method of claim 11, wherein the directional etch is a reactive ion etch.

13. The method of claim 11, wherein the metal transfer layer is stripped away from the substrate using a wet etch.

14. A method of making an imprint template, comprising:
providing a layer of imprintable medium on a transfer layer on a substrate;
using a master imprint template to imprint a pattern into the imprintable medium;
polymerizing the imprintable medium by exposing it to actinic radiation; and
etching the resulting polymer layer, the transfer layer and the substrate such that the imprinted pattern is transferred to the substrate, the substrate thereby becoming an imprint template bearing a pattern which is the inverse of a pattern provided on the master imprint template,
wherein a layer of resist or a monolayer of primer molecules is provided between the transfer layer and the imprintable medium.

15. The method of claim 14, wherein the resist is etched using a directional transfer etch, after the polymer layer is etched and before the transfer layer is etched.

16. The method of claim 14, wherein the transfer layer is a metal.

17. The method of claim 14, wherein the imprintable medium comprises a chlorinated monomer.

18. The method of claim 14, wherein the polymer layer is etched using a directional breakthrough etch.

19. The method of claim 14, wherein the layer of resist is provided between the transfer layer and the imprintable medium.

20. The method of claim 14, wherein the monolayer of primer molecules is provided between the transfer layer and the imprintable medium.

* * * * *